United States Patent [19]

Keller et al.

[11] 4,247,820
[45] Jan. 27, 1981

[54] SPIN RESONANCE SPECTROMETER

[75] Inventors: Toni Keller, Rheinstetten-Forchheim, Fed. Rep. of Germany; Werner Tschopp, Zürich-Fälladen, Switzerland; Günther R. Laukien, Rheinstetten-Forchheim, Fed. Rep. of Germany

[73] Assignee: Spectrospin AG, Switzerland

[21] Appl. No.: 958,570

[22] Filed: Nov. 7, 1978

[30] Foreign Application Priority Data

Nov. 18, 1977 [DE] Fed. Rep. of Germany ....... 2751521

[51] Int. Cl.³ .......................................... G01N 27/00
[52] U.S. Cl. .................................................. 324/321
[58] Field of Search ....................... 324/318, 321, 307

[56] References Cited

U.S. PATENT DOCUMENTS

| 3,091,732 | 5/1963 | Anderson et al. | 324/321 |
| 3,512,078 | 5/1970 | Hall | 324/321 |
| 3,588,677 | 6/1971 | Kleiman | 324/321 |

Primary Examiner—Michael J. Tokar

[57] ABSTRACT

The invention relates to a spin resonance spectrometer comprising a sample vessel 3 for receiving a substance to be investigated, a driving device having a rotor 31 in which the sample vessel is located, and at least one pipe 45 for the supply and discharge of test substances and if necessary rinsing media. The pipe 45 projects into the sample vessel 3 coaxially with respect to its axis of rotation. The sample vessel 3 is open at both its ends and the pipe 45 is connected to one end by a fluid tight low friction bearing 43.

9 Claims, 4 Drawing Figures

SPIN RESONANCE SPECTROMETER

The invention relates to a spin resonance spectrometer comprising a sample vessel for receiving substances to be investigated, a driving device having a rotor in which the sample vessel is located, and pipes for the supply and discharge of said substances, said pipes projecting into the sample vessel coaxially with respect to the axis of rotation of the sample vessel.

A spin resonance spectrometer of the above type is known from German Offenlegungsschrift No. 20 04 973. In this known spectrometer, the sample vessel is arranged with its axis of rotation vertical and is open at its upper end. Tubes for the supply and discharge of substances are arranged coaxially with respect to the axis of rotation of the sample vessel and with respect to each other, the tubes projecting into the open end. This arrangement requires a sample vessel having a relatively large diameter not only in order to have space for the tubes for the supply and discharge of substances, but also in order to ensure troublefree supply and discharge of the substances. In sample vessels having a small diameter, considerable capillary forces exist which make the filling and emptying of such sample vessels difficult. Furthermore, when filling a narrow sample vessel which is closed on its underside, small air pockets can be formed which considerably impair the accuracy of measurements.

U.S. Pat. No. 29 55 252 also discloses a spin resonance spectrometer which serves for the measurement of samples which are removed periodically. For this purpose, a sample vessel is formed from a section of a pipe through which samples of the substance to be tested are passed periodically. An arrangement of this type cannot be used however when a rotating sample vessel is required for the homogenization of samples in the spin resonance spectrometer.

It is an object of the present invention to ensure troublefree filling and emptying of a rotatable sample vessel in a spin resonance spectrometer of the aforementioned type even when the sample vessel has a very small diameter.

According to the present invention there is provided a spin resonance spectrometer comprising a sample vessel for receiving substances to be investigated, a driving device having a rotor in which the sample vessel is located, and at least one pipe for the supply and discharge of said substances, said pipe projecting into the sample vessel coaxially with respect to the axis of rotation of the sample vessel, characterised in that the sample vessel has openings at both ends of said axis, said at least one pipe communicating with one of said openings and being connected to the corresponding end of the sample vessel by a fluid-tight low friction sliding bearing.

In the spin resonance spectrometer according to the invention, troublefree filling of the sample vessel from one end is ensured without the formation of air bubbles because air is able to escape unhindered at the other end. Conversely, the sample vessel can be emptied in a troublefree manner by suction at one end, whereas air or other substances flow in from the other end. It is quite possible however to convey test substances in one direction through the sample vessel, i.e. to supply them at one end and simultaneously discharge them at the other end. If necessary, if the test substance is to be changed, the substance tested can be removed, the sample vessel can be cleaned by means of suitable rinsing fluids, and if desired dried by means of suitable gases, before a new test substance is introduced. In this way, it is possible for substances to be kept and examined in an atmosphere free from air and in particular in an atmosphere of a protective gas.

The invention facilitates not only the examination of sensitive substances, but also the progress of chemical reactions, in that two or more substances which react chemically together may be introduced together into the sample vessel. For this purpose, two or more pipes for supplying test substances may be provided which open into one end of the sample vessel, so that substances can be introduced simultaneously in the desired ratio. The progress of the reaction over a period of time may thus be followed by changes in the spectrum. With a spectrometer of this type, two or more pipes can be located coaxially with respect to each other, in the region in which they open into the sample vessel.

If the sample vessel communicates at both ends with pipes introduced through fluid-tight bearings, it is possible to provide desired excess or reduced pressure ratios in the sample vessel. Such an arrangement has the further advantage that it facilitates not only the examination of liquids, but also the examination of gases. For example, a gas can be introduced under pressure into the sample vessel and maintained therein by sealing off the pipes connected to the two ends of the sample vessel.

Since the quantities of substance to be transported are relatively small and a high conveying speed is not required, the end of the pipe connected to the sample vessel by a sliding bearing can have a relatively small diameter. Furthermore, there is no impediment to placing test substances and/or rinsing media under a pressure which is sufficient to force an adequately rapid change of the substance, even with pipes of small diameter. Even with a very small diameter of the end of the pipe engaging in the end of the sample vessel, there are no appreciable problems as regards the mounting and sealing of the pipe with respect to the end of the vessel, because the sliding bearing necessary for this causes only very slight friction as a result of its small diameter and the resultant small area of the surfaces sliding one on the other. Furthermore, even when the sample vessel rotates at high speed, the relative speeds at the surfaces to be sealed remain low. Therefore, a device of this type causes no significant disturbance as regards the centering and rotation of the rotor with the sample vessel.

In a preferred embodiment of the invention, the end of the pipe connected in a fluid-tight manner to the sample vessel is formed by a rigid capillary tube, which engages in a bush of resiliently yieldable and low friction synthetic material located at the end of the sample vessel and adjoining the outer end of which is a flexible hose. In an arrangement of this type, even the centering of the end of the pipe in the sample vessel is not critical, because the rigid capillary tube can follow any possible slight radial movements during the rotation of the sample vessel. A non-magnetic steel is particularly suitable for the production of the rigid capillary tube, because steel is largely neutral as regards chemicals and is resistant to corrosion, has good elasticity and provides surfaces with good sliding properties. In particular, rigid capillary tubes of non-magnetic steel are available in the form of injection needles. On the other hand, the thin flexible hose may consist appropriately of a thin synthetic hose, for which tetrafluoroethylene is particularly suitable.

If the axis of rotation of the sample vessel is vertical, it is adequate if one pipe for the supply and discharge of test substances, rinsing media and the like is connected, to the lower end of the sample vessel, because then the sample vessel can be both filled and emptied from the bottom. Air contained in the sample vessel may thus be forced out of the sample vessel which is open at its upper end, or flow from above into the sample vessel. On the other hand, the connection of pipes to both ends of the sample vessel provides investigation possibilities which do not exist when a pipe is connected to only one end. Furthermore, when pipes are connected at both ends in a fluid-tight manner, the sample vessel may have any orientation in space, which in many cases can be favourable for the construction of the spectrometer. A fluid-tight pipe connection to both ends of the sample vessel does however lead to certain difficulties as regards mounting, if the sample vessel is to be set in high speed rotation. With this problem in mind, one embodiment of the invention provides a vertical arrangement of the axis of rotation, the sample vessel comprising a cup-shaped or funnel-like enlargement at its upper end into which the end of a pipe projects. This enlargement can readily receive quantities of test substance, so that it is easy to equalize slight fluctuations between the flow of the medium supplied and the flow of the medium discharged. Furthermore, in very narrow sample vessels, this arrangement makes a non-contact pipe connection possible without this pipe having to have an undesirably small diameter.

In a further embodiment of the invention, a valve which opens in response to a predetermined pressure difference across it can be located at the upper end of the sample vessel. This valve closes-off the contents of the sample vessel with respect to the atmosphere if the same pressure prevails in the sample vessel as in the atmosphere. On the other hand, filling and emptying of the sample vessel is quite possible by producing an excess or reduced pressure. The valve not only protects the test substance from environmental influences, but also helps to prevent leakage from the sliding bearing at the lower end of the sample vessel. In a particularly simple manner, the afore-mentioned valve may be formed from a disc consisting of an elastic rubber material, which comprises at least one diametral slot.

A spectrometer according to the invention may be advantageously combined with a gas or liquid chromatograph in a simple manner such that fractions supplied by the chromatograph are supplied automatically to the spectrometer. For this purpose, it is sufficient to connect the devices for supplying and/or discharging test substances and possibly rinsing media to the chromatographs by way of pipes and to construct the latter such that they bring about the automatic supply and discharge of fractions separated by the chromatograph to or from the sample vessel. In a high pressure chromatograph, liquids under high pressure are available, which can be supplied directly to the sample vessel.

Embodiments of the invention will be described in detail hereafter by way of example with reference to the accompanying drawings. It will be appreciated that features revealed in the following description and drawings can be used individually or in any practical combination to provide other embodiments of the invention.

Figure 1:
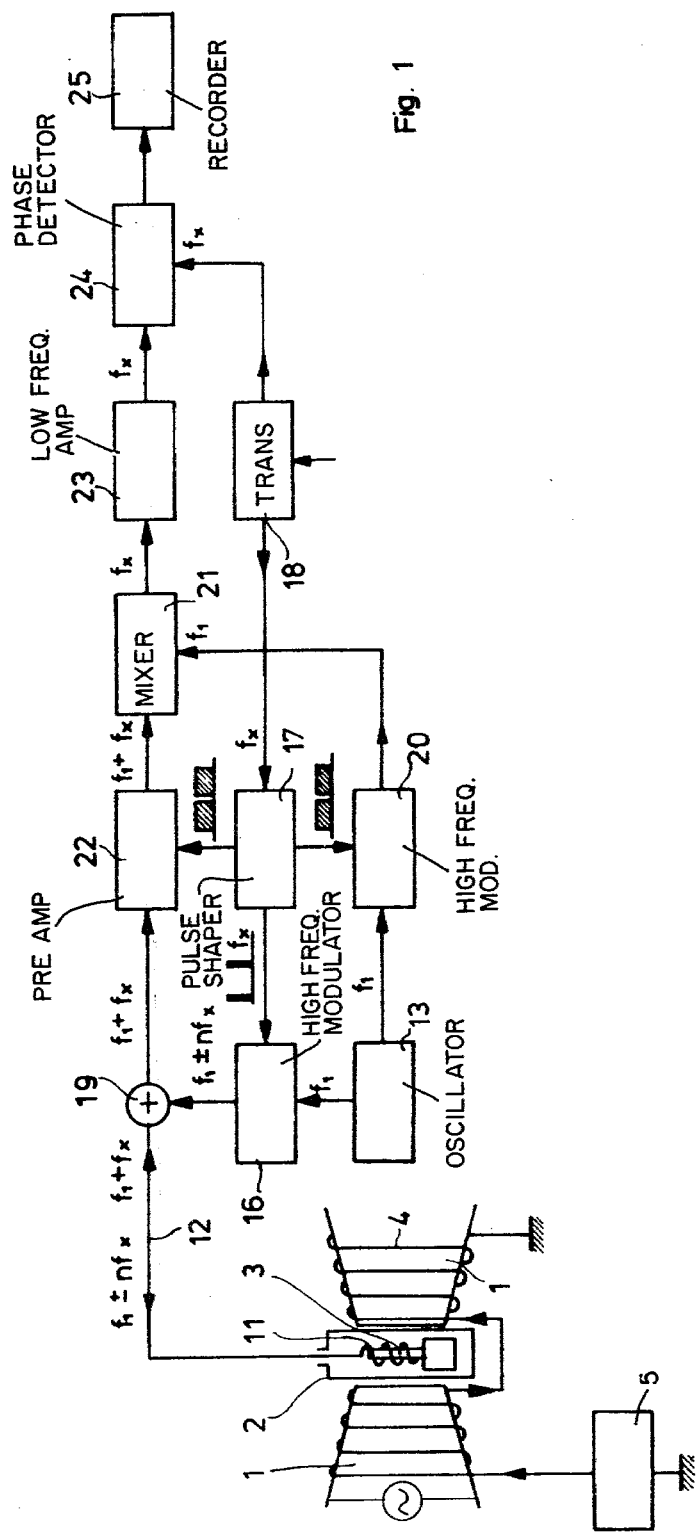
FIG. 1 is a diagrammatic illustration of a nuclear magnetic resonance spectrometer constructed according to the invention.

The nuclear magnetic resonance spectrometer illustrated in FIG. 1 as one embodiment of a spin resonance spectrometer comprises a magnet 1, defining an air gap in which is located a sample vessel 3, containing a sample to be investigated with a surrounding screen 2. The magnetic field in the air gap of the magnet 1 is kept constant with the assistance of a winding 4 located on the magnet, which winding is supplied with current by a current generator 5.

The spins of the substance located in the sample vessel 3 are stimulated by a coil 11 to which a pulse modulated high frequency signal is supplied by way of a lead 12. The carrier frequency $f_1$ of the pulse modulated high frequency signal is produced by an oscillator 13. The output of the oscillator 13 is connected to a high frequency modulator 16, to which modulation pulses at the frequency $f_x$ are supplied by a pulse shaper 17. The pulse repetition frequency $f_x$ is supplied to the pulse shaper 17 by a voltage/frequency transformer 18. The pulse repetition frequency $f_x$ is determined by a sweep voltage which is supplied to an input of the transformer 18. The input voltage to the transformer is for example a saw-tooth voltage. The output signal of the high frequency modulator 16 passes by way of a branch point 19 to the lead 12 and thus to the coil 11 for exciting the substance contained in the sample vessel 3.

The pulse shaper 17 is also connected to a second high frequency modulator 20, to which the carrier frequency $f_1$ is likewise supplied by the oscillator 13. The output of this second high frequency modulator 20 is connected to a mixer stage 21, to which the carrier frequency $f_1$ is supplied as a heterodyne frequency. The mixer stage 21 forms part of a receiving device, which also comprises a pre-amplifier 22 connected between the branching point 19 and the mixer stage 21, a low frequency amplifier 23 connected downstream of the mixer stage 21, a phase detector 24 adjoining the low frequency amplifier 23, and a recording instrument 25 connected to the phase detector. The construction and method of operation of such a spectrometer are known and described for example in German Pat. No. 21 26 744.

Figure 2:
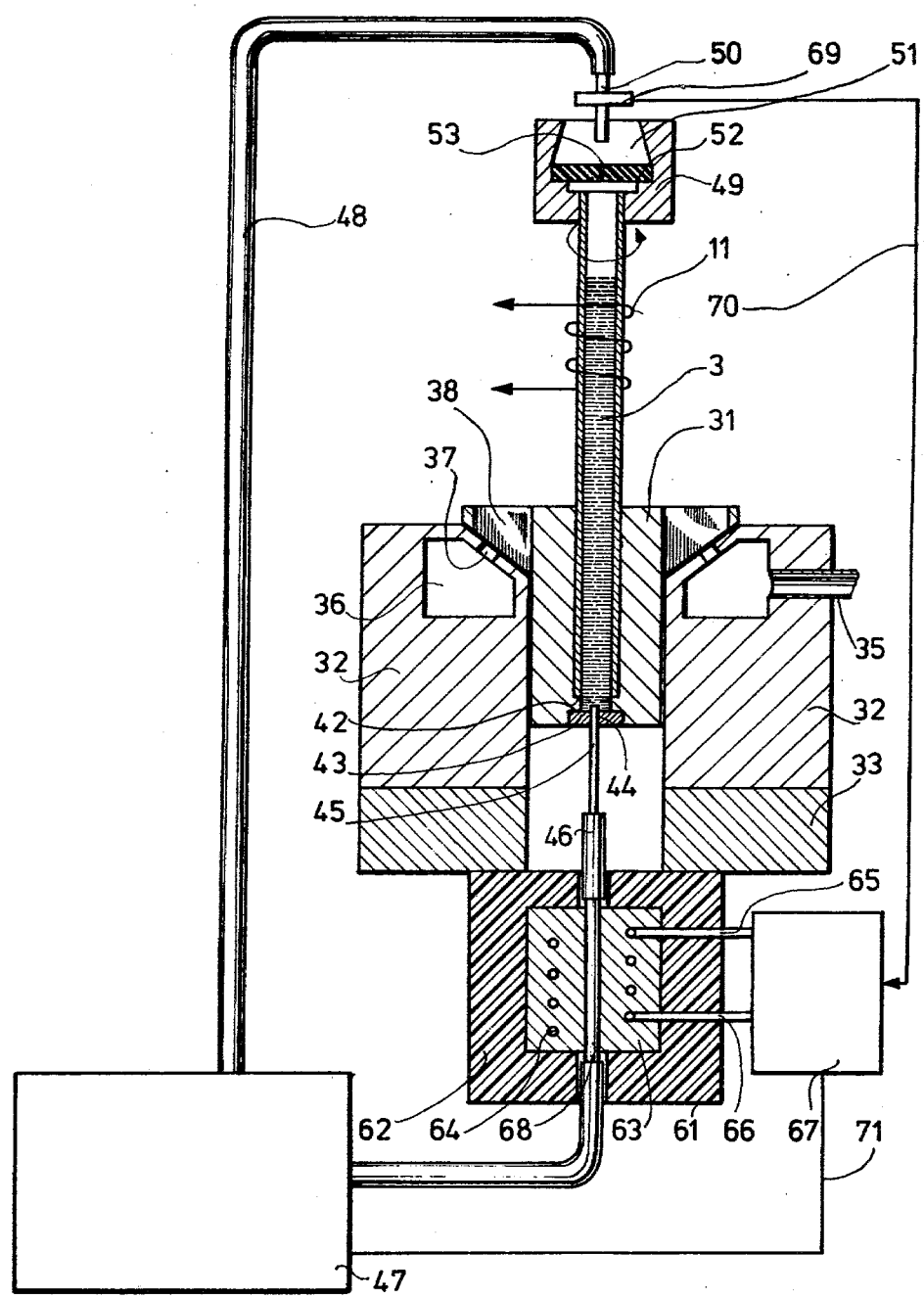
FIG. 2 is a diagrammatic illustration of a device for changing the test substance of the nuclear magnetic resonance spectrometer according to FIG. 1.

As shown clearly in FIG. 2, in the illustrated embodiment the sample vessel 3 is located in the rotor 31 of a turbine, whose stator 32 is located on a supporting component 33 of the spectrometer. The turbine forms a driving device, by which the sample vessel 3 can be set in rotation about its vertical longitudinal central axis. The turbine is driven by compressed air which is supplied through a pipe 35 to an annular channel 36 in the stator 32, from which the compressed air passes through slots 37 into a blade rim 38 located at the upper end of the rotor 31. The construction of such driving devices for rotating the sample vessel in electron spin resonance spectrometers is known per se and therefore does not need to be described in detail. It is solely noteworthy that in the embodiment illustrated, the rotor 31 is located close to the lower end of the sample vessel 3. Accordingly, the normal receiving coil 11 of the spectrometer surrounds the end of the sample vessel projecting upwards from the rotor 31.

Hitherto, it was normal to use so-called sample glasses as the sample vessel, which were constructed in a manner similar to test tubes and had a closed base. In the embodiment illustrated, the sample vessel 3 consists of a glass tube, which is inserted in an appropriate bore in the rotor 31 and extends so far as a shoulder 42 of the bore directly adjacent the underside of the rotor 31. Located below the sample vessel 3 in an enlarged section of the bore is a sealing ring 43, which may consist for example of a synthetic material of greater or lesser elasticity. This sealing ring 43 forms a slide bushing and is provided with an opening 44 which is concentric with respect to the longitudinal central axis of the sample vessel 3, engaging in which opening 44 is a capillary tube 45. The tube 45 forms the rigid end of a pipe which also comprises a thin flexible hose 46 of a synthetic material. The hose 46 provides a connection between the end of the capillary tube 45 projecting from the rotor 31 and devices 47 for supplying and/or discharging test substances and possibly rinsing media.

The rigid capillary tube 45 may consist of non-magnetic steel for example. Capillary tubes of this type are used for producing injection needles for example. The outer diameter of the tube may be approximately 1 mm. The use of a capillary tube of non-magnetic steel has the advantage that steel is extremely robust and largely resistant to corrosion and has good sliding properties.

Although the idea of providing a liquid or fluid-tight connection to the sample vessel appears strange in view of the high speed at which the sample vessel rotates during operation, a connection of this type causes no problems. This is because the small outer diameter of the capillary tube 45 results in frictional forces at the sealing surface and relative speeds between the surfaces to be sealed with respect to each other which are very low. It is therefore quite possible to achieve a trouble-free seal having a long life expectancy, without appreciably hindering rotation of the sample vessel.

The afore-described arrangement is completely adequate to introduce liquids without any difficulty, into the sample vessel 3 and for discharging such liquids therefrom, because the opening present at the upper end permits air contained in the sample glass to escape easily, on filing and discharging the fluid, air could to enter the sample glass easily on discharge. However, for many applications, it is desirable to connect a pipe 48 to the upper end of the sample vessel and to connect the latter to the devices 47 for supplying and/or discharging test substances and possibly rinsing media, because then it is possible to pass test substances and rinsing media, including drying gases, in one direction through the sample vessel. In this respect, special effects can be achieved as regards the test substance, such as for example measuring the relaxation time T1 of a substance flowing through the sample vessel.

Basically, the connection of the pipe 48 to the upper end of the sample vessel 3 could take place in the same manner as the connection of the pipe 46, i.e. using a capillary tube which projects into the bore of a resilient rubber seal. However in this case, considerable mounting problems can arise, because both capillary tubes have to be aligned with each other with extremely high accuracy, in order not to considerably slow down the sample vessel 3 and so as not to disturb the mounting of the rotor 31. Therefore, a non-contacting connection of the pipe 48 is to be preferred at the upper end, as is provided in the embodiment illustrated. For this purpose, the upper end of the sample vessel 3 is provided with a funnel-shaped or cup-shaped enlargement 49, into which a tube 50 located at the end of the pipe 48 projects from above without contact. A medium rising in the cavity 51 of the enlargement 49 can be readily sucked-off by way of this tube, so that a circulation from the lower end to the upper end of the sample vessel can be easily maintained.

Figure 3:
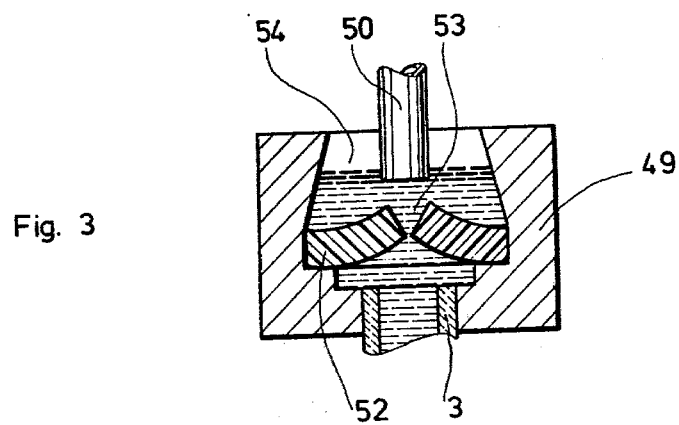
FIG. 3 shows to an enlarged scale a pipe connection at the upper end of the sample vessel of the device according to FIG. 2 with the valve opened.

Inserted in the enlargement 49 is a further resilient rubber disc 52, which has a diametral slot 53 in the region of its centre. If the same pressure prevails on both sides of the disc 52, the disc assumes the flat position illustrated in FIG. 2, in which the surfaces defining the slot 53 are located side-by-side. The sample vessel 3 is thus closed-off in a fluid-tight manner at its upper end. Due to this, not only is the medium located in the sample vessel protected from environmental influences, but the medium is prevented from dripping downwards out of the sample tube. On the other hand, if an excess pressure is produced by supplying a medium through the pipe 46 in the sample vessel 3, the disc 52 curves upwards, as illustrated in FIG. 3, so that the slot 53 opens and the medium 54 can pass through the slot 53 in the disc 52. Conversely, the disc 52 curves downwards when the slot 53 opens in the opposite direction to the position shown in FIG. 3, when a reduced pressure is produced in the sample vessel, so that air for example or another medium supplied through the pipe 48 can flow from above into the sample vessel 3.

The devices 47 for supplying and/or discharging test substances and possibly rinsing media comprise the necessary containers for test substances and rinsing media, pipes and valves as well as pumps or other pressure sources, which are necessary in order to introduce substances into the sample vessel 3 up to the height of the receiving coil 11, to discharge the latter after recording the spectrum or to pass the latter continuously through the sample vessel 3, on the basis of control commands given manually or introduced automatically.

Figure 4:
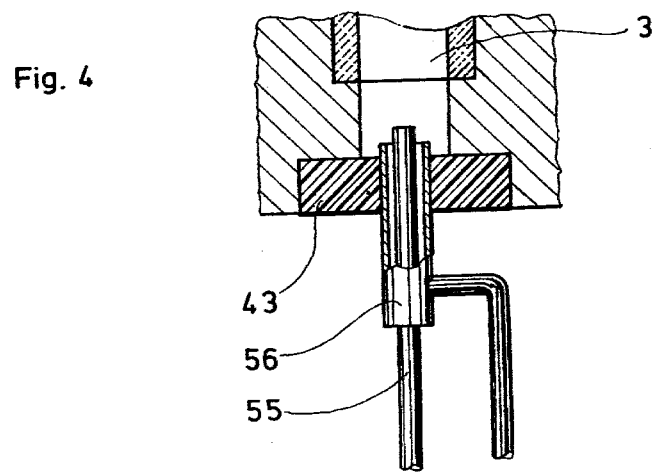
FIG. 4 is a cross section to an enlarged scale through the pipe connection at the lower end of the sample vessel in a variation of the device according to FIG. 2.

Thus, the direction of supply and discharge can be selected as desired by using excess pressure and reduced pressure. Furthermore, it is possible to clean the sample vessel 3 by introducing and drawing-off one or more rinsing fluids and to dry the latter by blowing a drying gas therethrough. The possibility also exists of working under a protective gas, in that before introducing the test substance, the system is filled with the protective gas, which is then displaced by the test substance. The possibility also exists of introducing several test substances into the sample vessel 3 simultaneously, for example in order to observe by spectrometry the progress of chemical reactions between the substances introduced. For this purpose, as shown in FIG. 4, it is possible for two pipes 55 and 56 arranged coaxially with respect to each other to open into the lower end of the sample vessel 3, which pipes are connected to the device 47 for supplying and/or discharging test substances and possibly rinsing media.

In the embodiment illustrated in FIG. 2, located below the supporting component 33 is a heat exchanger 61 surrounding the pipe 46, which exchanger comprises a block 63 inside an insulating jacket 62. Located in block 63 is a helical channel 64, the ends of which are connected by pipes 65 and 66 to a temperature regulating unit 67, which is installed to supply heating or cooling fluids through the channel 24. It is thus possible to impart a desired temperature to the block 63 and with it the medium flowing through the pipe section 68 located inside the block 63. This medium may firstly be a rinsing fluid which serves to impart the desired temperature to the sample vessel 3, before the test substance likewise given the desired temperature is introduced into the sample vessel 3. In order to ascertain whether the sample vessel has reached the desired temperature, a temperature sensor 69 can be located at the outlet of the sample vessel 3, which sensor is connected by a lead 70 to the temperature regulating unit 67. Thus, by way of a control line 71, the temperature regulating unit 67 may cause the devices 47 for supplying test substances and rinsing media to supply the test substance after the rinsing media, when the temperature sensor 69 indicates that the sample vessel 3 has reached the desired temperature. During measurement, in order to prevent a change in the test substance located in the sample vessel 3, due to an exchange of heat with the environment, it is possible to ensure in a manner which is not shown that the surroundings of the sample vessel 3 are kept at a temperature which varies only slightly or not at all from the desired sample temperature.

Overall, in a spectrometer with a rotating sample vessel, the invention makes it possible to undertake a change of sample fully automatically without mechanical intervention, which not only has the advantage that no complicated devices are required for the mechanical movement of sample vessels or the like to be exchanged, but also that a careful setting of the spectrometer is not impaired by changing the sample. Thus, a combination with other analytical equipment is possible, in particular with a chromatograph, whose fractions can be passed automatically through the spectrometer for further investigation. Moreover, the invention makes it possible to impart a desired temperature to the test substances and to maintain this temperature for the duration of the investigation. Finally, the invention makes it possible to introduce several substances into the sample vessel simultaneously, in order to be able to observe chemical reactions taking place in the sample vessel. Therefore, the invention opens up many new possibilities for spin resonance spectrometry, which possibilities are of use both for scientific research as well as for the continuous monitoring of chemical products.

We claim:

1. A spin resonance spectrometer comprising a tubular sample vessel open at each end for receiving substances to be investigated, a driving device having a rotor in which the sample vessel is located and rotatable about a central axis, and a pipe for the supply and discharge of said substances through one end of said sample vessel, said pipe being mounted along the axis of rotation in a fluid tight slide bearing, said bearing sealing the one end of said vessel.

2. The spin resonance spectrometer in accordance with claim 1, wherein said sample vessel is arranged so that its axis of rotation is vertical, with the supply and discharge pipe at its lower end, the upper end of said vessel being provided with a cup-shaped member and includes conduit means for the supply and discharge of fluid substances to and from said cup-shaped member.

3. A spin resonance spectrometer according to claim 1, including a second pipe for the supply and discharge of substances to said sample vessel, said second pipe extending coaxially with said first mentioned pipe.

4. A spin resonance spectrometer according to claims 1 or 2, wherein said pipe is formed by a rigid capillary tube and said bearing comprises a bushing consisting of a resilient low friction synthetic material, the end of the capillary tube remote from the bushing being joined to a flexible hose.

5. A spin resonance spectrometer according to claim 4, wherein the rigid capillary tube consists of non-magnetic steel.

6. A spin resonance spectrometer according to claim 3, wherein the flexible hose consists of a thin hose of synthetic material.

7. A spin resonance spectrometer according to claim 5, wherein the said material is tetrafluoroethylene.

8. A spin resonance spectrometer according to claim 1 or 2 or 3, wherein a valve which opens in response to pressure differences across it is located at the upper end of the sample vessel.

9. The spin resonance spectrometer according to claim 8, wherein the valve is formed by a disc of a resilient rubber material in which at least one diametral slot is provided.

* * * * *